(12) United States Patent
Shen et al.

(10) Patent No.: US 9,875,999 B2
(45) Date of Patent: Jan. 23, 2018

(54) DISPLAY SUBSTRATE AND MANUFACTURING METHOD THEREOF, AND DISPLAY DEVICE

(71) Applicant: BOE Technology Group Co., Ltd., Beijing (CN)

(72) Inventors: Wulin Shen, Beijing (CN); Yanzhao Li, Beijing (CN); Jingang Fang, Beijing (CN); Ruwang Guo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/769,144

(22) PCT Filed: Nov. 7, 2014

(86) PCT No.: PCT/CN2014/090615
§ 371 (c)(1),
(2) Date: Aug. 20, 2015

(87) PCT Pub. No.: WO2016/019646
PCT Pub. Date: Feb. 11, 2016

(65) Prior Publication Data
US 2016/0268239 A1    Sep. 15, 2016

(30) Foreign Application Priority Data
Aug. 7, 2014    (CN) .......................... 2014 1 0387601

(51) Int. Cl.
*H01L 25/16* (2006.01)
*H01L 21/77* (2017.01)
(Continued)

(52) U.S. Cl.
CPC ............ *H01L 25/167* (2013.01); *H01L 21/77* (2013.01); *H01L 25/0753* (2013.01);
(Continued)

(58) Field of Classification Search
None
See application file for complete search history.

(56) References Cited

U.S. PATENT DOCUMENTS 8,183,590 B2 * 5/2012 Suzuki .................. H05K 1/183
257/88
2002/0140643 A1    10/2002 Sato
(Continued)

FOREIGN PATENT DOCUMENTS

| CN | 1348579 A | 5/2002 |
| CN | 1472722 A | 2/2004 |

(Continued)

OTHER PUBLICATIONS

Sep. 23, 2016—(CN)—Second Office Action Appn 201410387601.2 with English Tran.
(Continued)

*Primary Examiner* — Andres Munoz
(74) *Attorney, Agent, or Firm* — Banner & Witcoff, Ltd.

(57) ABSTRACT

A display substrate is provided, the display substrate comprising at least one pixel unit, the pixel unit including a pixel driving circuit (A2) located in an active driving circuit backplane, and a light-emitting diode chip (A1) disposed on the active driving circuit backplane; the light-emitting diode chip (A1) being electrically connected with the pixel driving circuit (A2). And a manufacturing method of the display substrate, and a display device comprising the display substrate are further provided.

11 Claims, 5 Drawing Sheets

(51) Int. Cl.
  H01L 33/30 (2010.01)
  H01L 33/32 (2010.01)
  H01L 33/60 (2010.01)
  H01L 25/075 (2006.01)
  *H01L 27/12* (2006.01)
  *H01L 27/28* (2006.01)
  *H01L 33/62* (2010.01)

(52) U.S. Cl.
  CPC ........ H01L 27/124 (2013.01); H01L 27/1259 (2013.01); H01L 33/30 (2013.01); H01L 33/32 (2013.01); H01L 33/60 (2013.01); *H01L 27/1222* (2013.01); *H01L 27/1225* (2013.01); *H01L 27/1255* (2013.01); *H01L 27/283* (2013.01); *H01L 33/62* (2013.01); *H01L 2933/0066* (2013.01)

(56) References Cited

U.S. PATENT DOCUMENTS

| | | | |
|---|---|---|---|
| 2003/0178627 A1* | 9/2003 | Marchl | H01L 25/0753 257/80 |
| 2006/0197102 A1* | 9/2006 | Ogihara | G03G 15/326 257/99 |
| 2006/0270097 A1 | 11/2006 | Kim et al. | |
| 2012/0249510 A1* | 10/2012 | Jankovic | G09G 3/3233 345/211 |
| 2013/0105837 A1* | 5/2013 | West | H01L 33/60 257/98 |
| 2014/0027709 A1* | 1/2014 | Higginson | H01L 23/3171 257/13 |
| 2014/0353700 A1* | 12/2014 | Chen | H01L 33/0079 257/95 |

FOREIGN PATENT DOCUMENTS

| | | |
|---|---|---|
| CN | 101315744 A | 12/2008 |
| CN | 101847646 A | 9/2010 |
| CN | 101859714 A | 10/2010 |
| CN | 101937646 A | 1/2011 |

OTHER PUBLICATIONS

May 15, 2015—International Search Report and Written Opinion Appn PCT/CN2014/090615 with English Tran.
Jul. 6, 2016—(CN) First Office Action Appn 201410387601.2 with English Tran.

* cited by examiner

DISPLAY SUBSTRATE AND MANUFACTURING METHOD THEREOF, AND DISPLAY DEVICE

The application is a U.S. National Phase Entry of International Application No. PCT/CN2014/090615 filed on Nov. 7, 2014, designating the United States of America and claiming priority to Chinese Patent Application No. 201410387601.2 filed on Aug. 7, 2014. The present application claims priority to and the benefit of the above-identified applications and the above-identified applications are incorporated by reference herein in their entirety.

TECHNICAL FIELD

Embodiments of the present disclosure relate to a display substrate and a manufacturing method thereof, and a display device.

BACKGROUND

A Light Emitting Diode (LED) display has been widely used in a display panel of an instrument, a meter and a home appliance; however, the common LED displays available in the market are all liquid crystal display televisions using an LED as a backlight. Since a liquid crystal panel itself does not emit light, but rotates liquid crystal molecules by using a voltage to produce a gray scale, and determines a color of a picture by manipulating light and shade of a color filter. Thus, the liquid crystal television with the LED backlight only uses a strip or dot LED lamp to provide the backlight, but does not make full use of such a feature that the LED has very high color fidelity.

On the other hand, an existing Active Matrix/Organic Light Emitting Diode (AMOLED) panel implements organic light-emitting display with a high response speed, high brightness, high contrast, and a relatively wide viewing angle, mainly by using self-illumination of an organic layer of an Organic Light Emitting Diode (OLED); however, it still not as good as the LED in accuracy of displaying three colors, i.e., Red/Green/Blue (RGB); in addition, the organic light-emission used thereby is flawed in terms of service life, and thus, it is difficult to implement durable display with high color fidelity and high color uniformity.

SUMMARY

According to one embodiment of the present disclosure, there is provided a display substrate, comprising at least one pixel unit, the pixel unit including a pixel driving circuit located in an active driving circuit backplane, and a light-emitting diode chip disposed on the active driving circuit backplane; the light-emitting diode chip being electrically connected with the pixel driving circuit.

In one example, the pixel driving circuit is configured to output a corresponding driving current to an electrode of the light-emitting diode chip, according to an external control signal;

the light-emitting diode chip configured to emit light with a corresponding luminance according to a current input from the electrode of the light-emitting diode chip.

In one example, the light-emitting diode chip is adhered to the active driving circuit backplane through an adhesive layer.

In one example, a reflective layer is further provided between the light-emitting diode chip and the active driving circuit backplane.

In one example, the light-emitting diode chip has a size of a micron level, and includes a red light-emitting diode, a green light-emitting diode or a blue light-emitting diode.

In one example, a substrate of the red light-emitting diode is made of GaAs; a substrate of the green light-emitting diode is made of SiC; and a substrate of the blue light-emitting diode is made of GaN.

In one example, the light-emitting diode chip is an inorganic light-emitting diode chip.

In one example, the light-emitting diode chip and the pixel driving circuit are provided with a planarization layer thereon.

In one example, the planarization layer is provided with a via hole therein, the planarization layer is provided with a conductive layer thereon, and the conductive layer is configured to implement an electrical connection between the electrode of the light-emitting diode chip and the pixel driving circuit through the via hole.

In one example, the pixel driving circuit includes a thin film transistor.

In one example, the thin film transistor is an oxide thin film transistor, an amorphous silicon thin film transistor, a low-temperature polysilicon thin film transistor, or an organic thin film transistor.

In one example, the pixel driving circuit includes a first thin film transistor, a second thin film transistor and a capacitor, the first thin film transistor has a gate electrode connected with an external scanning signal, a first electrode connected with an external data signal, and a second electrode connected with a gate electrode of the second thin film transistor and a first terminal of the capacitor;

the second thin film transistor has a first electrode connected with a second terminal of the capacitor as well as an anode of the light-emitting diode in the light-emitting diode chip, and a second electrode connected with a power source voltage;

the first electrode and the second electrode are a source electrode and a drain electrode of the thin film transistor, respectively, or the first electrode and the second electrode are a drain electrode and a source electrode of the thin film transistor, respectively.

In one example, the adhesive layer has a moisture content of less than 0.1%.

According to another embodiment of the present disclosure, there is provided a display device, the display device comprising any display substrate described above.

According to still another embodiment of the present disclosure, there is provided a manufacturing method of a display substrate, the display substrate comprising at least one pixel unit, the pixel unit including a pixel driving circuit and a light-emitting diode chip, the method comprising:

forming an active driving circuit backplane, the active driving circuit backplane including the pixel driving circuit;

forming an adhesive layer on the active driving circuit backplane, and adhering the light-emitting diode chip to the active driving circuit backplane in a region corresponding to the pixel unit; and forming an electrical connection between an electrode of the light-emitting diode chip and the pixel driving circuit.

In one example, before the forming an adhesive layer on the active driving circuit backplane, the method further comprises:

forming a reflective layer on the active driving circuit backplane.

In one example, after the adhering the light-emitting diode chip, the method further comprises:

performing a low-temperature annealing and curing, in a case that characteristics of the thin film transistor and the light-emitting diode in the display substrate are not affected.

In one example, forming the electrical connection between the electrode of the light-emitting diode chip and the pixel driving circuit includes:

forming a planarization layer on the light-emitting diode chip and the pixel driving circuit;

forming a via hole in the planarization layer; and forming a conductive layer on the planarization layer, the conductive layer being used for implementing the electrical connection between the electrode of the light-emitting diode chip and the pixel driving circuit through the via hole.

In one example, the adhesive layer has a moisture content of less than 0.1%.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

FIG. 3 (b) is a longitudinal cross-section view of each pixel unit at the pixel driving circuit (in vicinity of a first thin film transistor) on a display substrate according to an embodiment of the present disclosure;

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
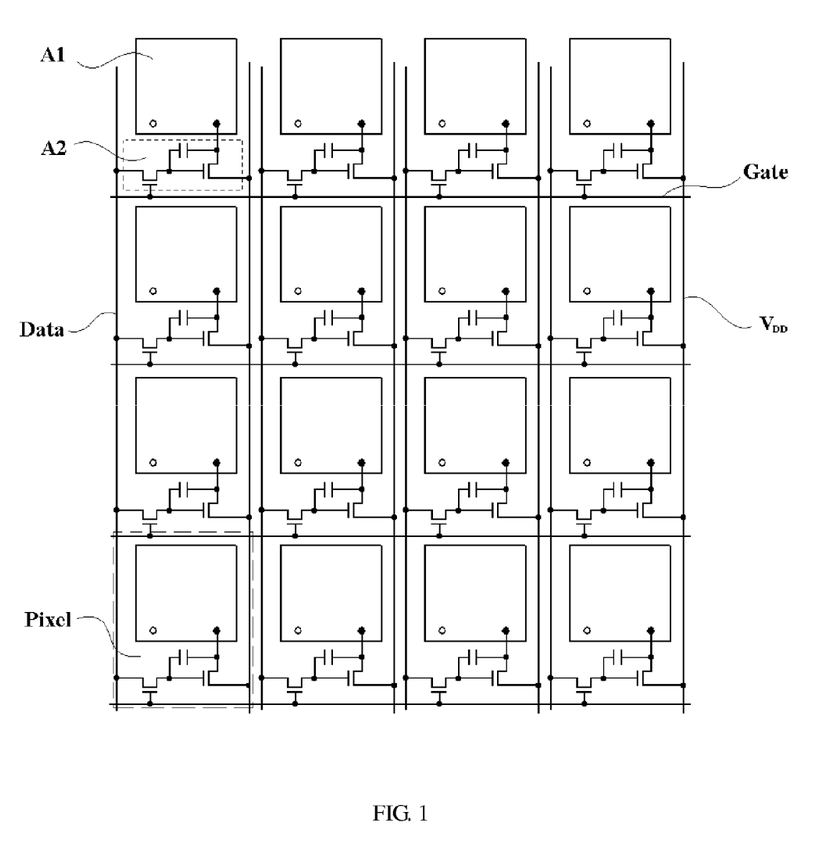
FIG. 1 is a structural schematic diagram of a display substrate according to an embodiment of the present disclosure.

An embodiment of the present disclosure provides a display substrate, with reference to FIG. 1, the display substrate comprising at least one pixel unit (Pixel), the pixel unit including a pixel driving circuit A2 located in an active driving circuit backplane, and a light-emitting diode (LED) chip A1 disposed on the active driving circuit backplane. The LED chip A1 is electrically connected with the pixel driving circuit A2.

The pixel driving circuit A2 is used for outputting a corresponding driving current to an electrode of the LED chip A1 (the electrode is corresponding to a solid point and a hollow point within a region A1 in FIG. 1), according to an external control signal (e.g., a Gate, a Data and a VDD as illustrated in FIG. 1). And the LED chip A1 is used for emitting light with a corresponding luminance according to a current input from the electrode of the LED chip A1.

For example, the light-emitting diode chip in a display panel according to the embodiment of the present disclosure is an inorganic light-emitting diode chip.

Of course, a 4×4 pixel unit array as illustrated in FIG. 1 is only one example, features thereof, such as quantity, shape, arrangement and structure of the pixel driving circuit not described above can all be equivalently replaced with reference to this embodiment, without departure of the technical solution from the spirit and scope of this embodiment.

It can be seen that, the LED chip A1 located in the pixel unit can emit light with the corresponding luminance, as driven by the driving current input from the electrode, that is, in this embodiment, a magnitude of the current driving light emission of the LED is controlled by the pixel driving circuit A2, the light emission of the LED is controlled by using the display substrate, and thus, it can be fabricated into an active matrix LED display panel or a display device. Since it makes full use of preferred display characteristics of the LED, as compared with an AMOLED, it is not limited by a service life of an organic light-emitting material, and has a better color fidelity.

Figure 2:
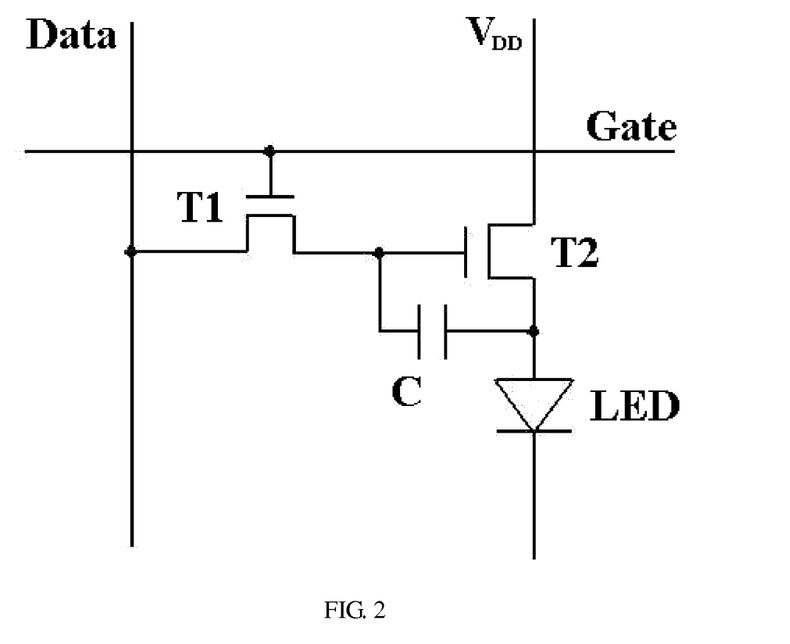
FIG. 2 is a circuit diagram of a pixel driving circuit according to an embodiment of the present disclosure.

A circuit diagram of the pixel driving circuit A2 illustrated in FIG. 1 in each pixel unit is illustrated in FIG. 2. The pixel driving circuit A2 includes a first thin film transistor T1, a second thin film transistor T2 and a capacitor C (in addition, an LED light-emitting element in the LED chip A1 is represented by the LED in the diagram).

The first thin film transistor T1 has a gate electrode connected with an external scanning signal Gate, a first electrode connected with an external data signal Data, and a second electrode is connected with a gate electrode of the second thin film transistor T2 and a first terminal of the capacitor C; the second thin film transistor T2 has a second electrode connected with a power source voltage VDD, and a first electrode connected with a second terminal of the capacitor C as well as an anode of the light-emitting diode LED in the LED chip A1.

The first electrode and the second electrode are a source electrode and a drain electrode of the thin film transistor, respectively, corresponding to a case where the T1 and the T2 belong to a thin film transistor of an N-channel type. When the T1 and the T2 belong to the thin film transistor of a P-channel type, the first electrode and the second electrode are a drain electrode and a source electrode of the thin film transistor, respectively.

The pixel driving circuit A2 of the 2T1C can provide the driving current for the LED under control of the external scanning signal Gate, the external data signal Data and the power source voltage VDD, that is, implement control of light emission of each LED by the display substrate; moreover, the circuit is simple in structure and easy to implement. Of course, in order to achieve a better display effect, a module having a function of compensating a Thin film transistor (TFT) threshold voltage, or an equivalent structure or a pixel driving circuit of other structure can be added in the pixel driving circuit A2, which is implemented in a variety of modes in the prior art, and will not be repeated here; and certainly, these additions and equivalent replacements apparently are performed without departing from the spirit and principle of this embodiment.

Figure 3A:
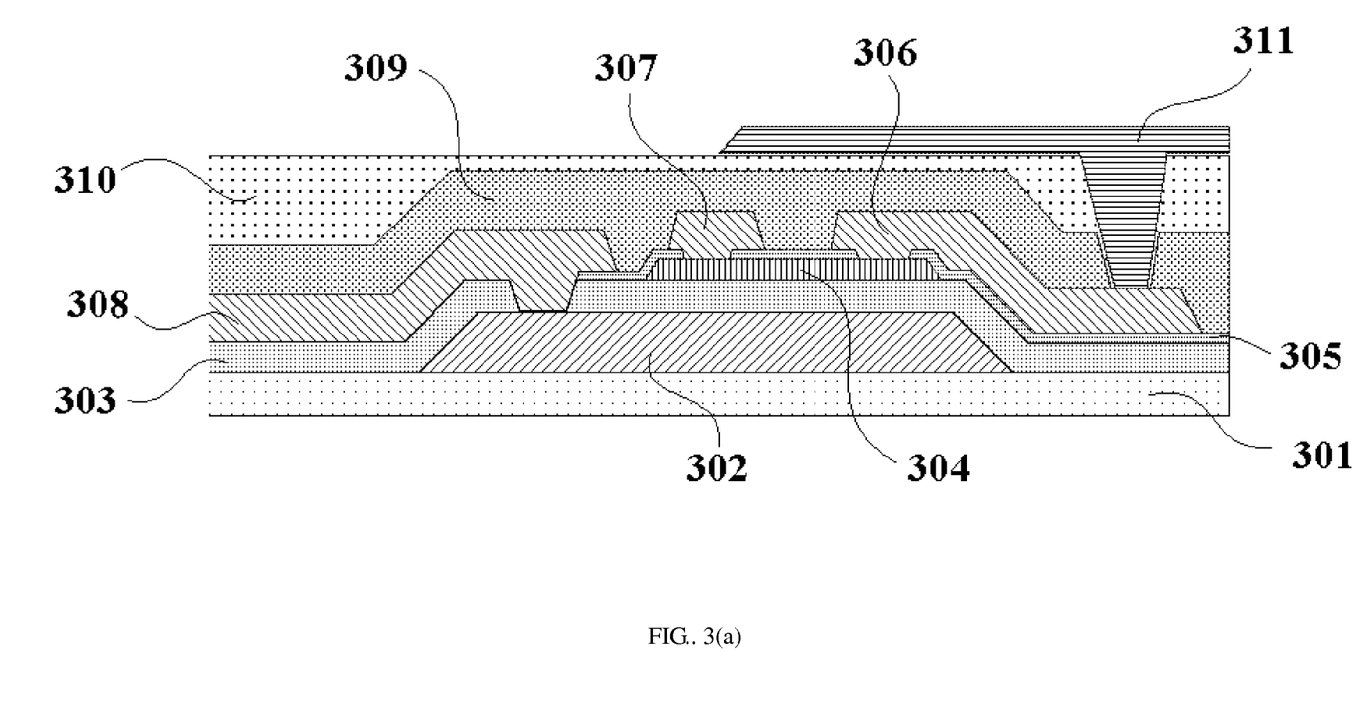
FIG. 3(a) is a longitudinal cross-section view of each pixel unit at the pixel driving circuit (in vicinity of a second thin film transistor) on a display substrate according to an embodiment of the present disclosure.
Figure 3B:
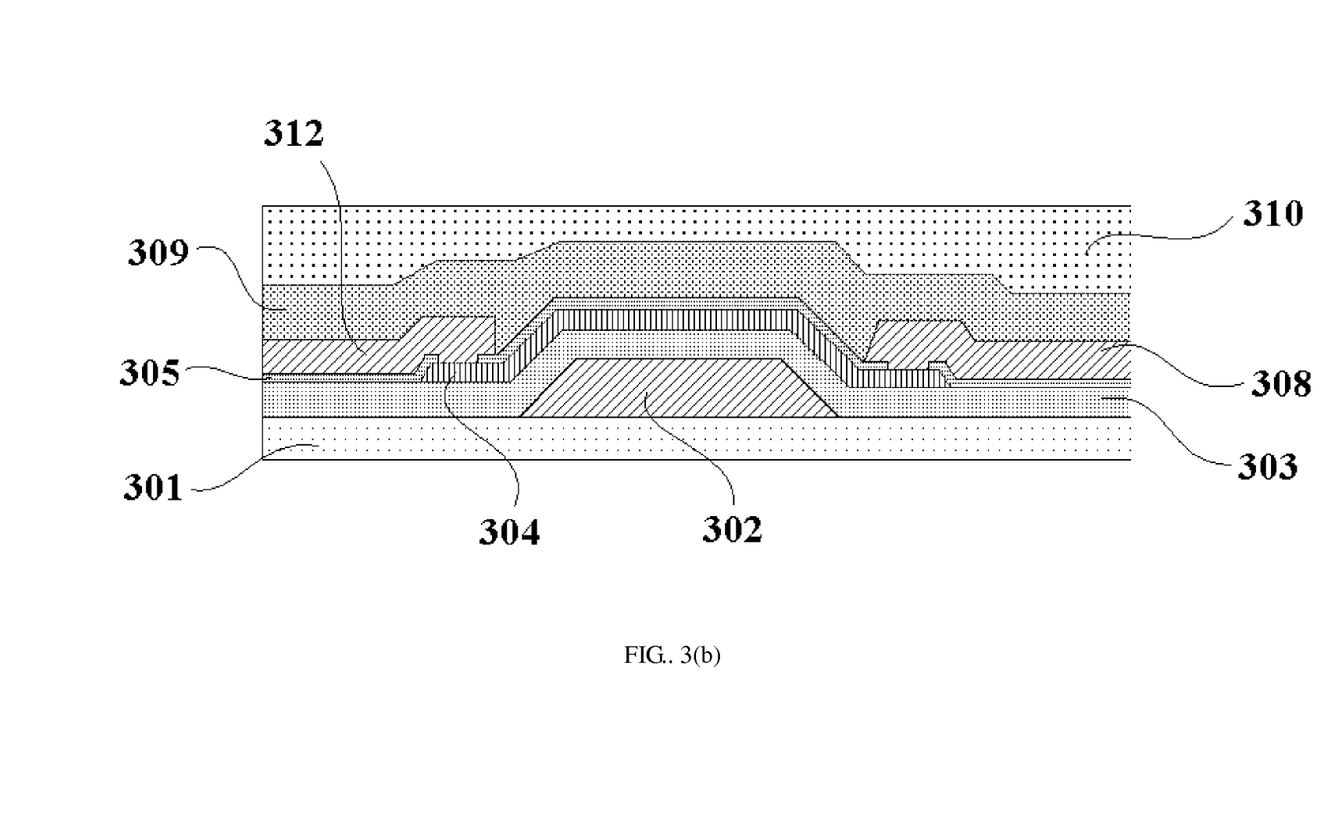

With the pixel driving circuit A2 of the 2T1C as an example, a cross-sectional structure of each pixel unit Pixel at the pixel driving circuit A2 on the display substrate is illustrated in FIG. 3(a) (the second thin film transistor T2) and FIG. 3(b) (the first thin film transistor T1). It can be seen that a gate electrode 302, a gate insulating layer 303, a semiconductor active layer 304, an etching blocking layer 305, a source electrode 306 of the T2, a drain electrode 307 of the T2, a drain electrode (or a drain electrode lead) 308 of the T1, a source electrode 312 of the T1, a passivation layer 309, a planarization layer 310 and a conductive layer (which, for example, may be made of a transparent conductive material, i.e., indium tin oxide (ITO)) 311 are formed on the active driving circuit backplane 301.

In some examples, the gate electrode 308, the source electrode or the drain electrode (306, 307, 308 and 312) of the thin film transistor are made of materials of Cu, Al, Mo, Nd and Ag, or alloys formed by any combination of these types of elements. As conductive materials for forming the gate electrode, the source electrode or the drain electrode of the thin film transistor, they firstly can satisfy conductivity, and secondly, are conducive to film formation, and have excellent durability, which is conductive to simplification of a fabrication process and reduction of costs.

In some examples, the gate insulating layer 203 and the etching blocking layer 305 are made of silicon oxide, silicon nitride or silicon oxynitride. It can block the current from passing therethrough, that is, it has a better insulating property, and at the same time, is easy to form at a lower cost.

In some examples, the semiconductor active layer 304 is made of amorphous silicon, polycrystalline silicon, oxide or an organic semiconductor. Corresponding to different materials for forming the semiconductor, the TFTs also belong to different types: an oxide thin film transistor (corresponding to an oxide semiconductor), an amorphous silicon thin film transistor (corresponding to amorphous silicon (a-Si)), a low-temperature polysilicon thin film transistor (corresponding polysilicon p-Si) or an organic thin film transistor. For different types of TFTs, the fabrication processes and signal polarities may be different, which belong to the prior art, and will not be repeated here. Further, the oxide semiconductor is oxide or oxynitride of any one of elements from In, Ga, Zn, Sn and Tl, or oxide or oxynitride formed by any combination of these elements. For example, ZnO, CdO, $SnO_2$, amorphous IGZO (In—Ga—Zn—O), AlCaN, GaN, InAlN, and the like.

By using the pixel driving circuit structure as described above, a function of outputting the driving current by the LED can be implemented, and meanwhile, it adapts to an existing fabrication process of the display panel, and is easy to implement. Of course, when other pixel driving circuit is used, a longitudinal structure of the TFT circuit can also be designed with reference to this longitudinal structure, apparently without departure from the spirit and scope of the of the technical solution of the embodiment of the present disclosure.

Figure 4:
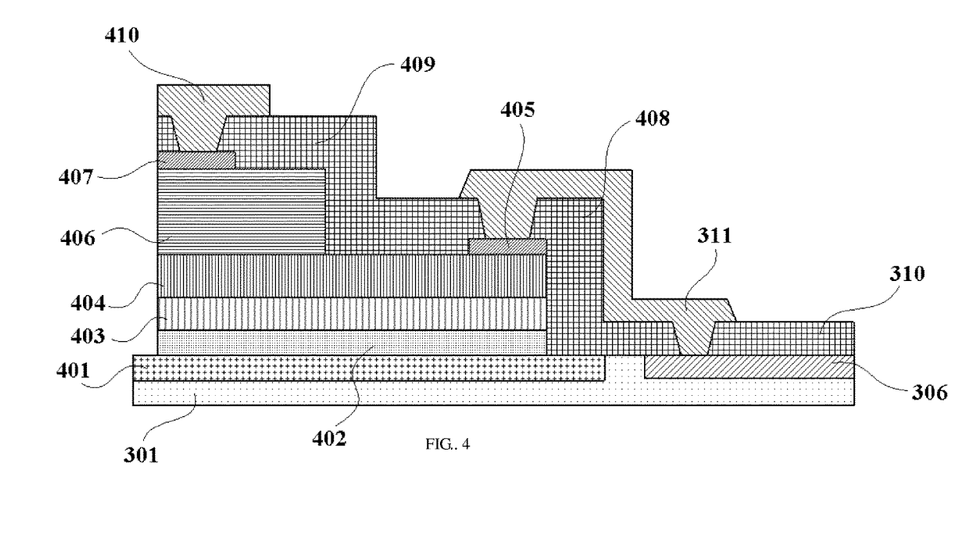
FIG. 4 is a longitudinal cross-section view of each pixel unit at an LED chip on a display substrate according to an embodiment of the present disclosure.

On the other hand, referring to FIG. 4 for a cross-sectional structure at the LED chip A1 in the pixel unit Pixel, a reflective layer 401, an adhesive layer 402, an LED substrate 403, an n-type semiconductor 404 in the LED, an electrode 405 connected with the n-type semiconductor, a p-type semiconductor 406 in the LED, an electrode 407 connected with the p-type semiconductor, planarization layers (310, 408 and 409) and conductive layers (311 and 410) are formed on the active driving circuit backplane 301. FIG. 4 includes the source electrode 306 of the T2, the planarization layer 310 and the conductive layer 311 as described above, whose labels are consistent with those in FIG. 3(a). The LED substrate 403, the n-type semiconductor 404 in the LED, the electrode 405 connected with the n-type semiconductor, the p-type semiconductor 406 in the LED, and the electrode 407 connected with the p-type semiconductor constitute the LED chip A1. Thus, FIG. 4 includes a portion of the pixel driving circuit A2, and also includes the LED chip A1, which is intended to demonstrate an example of a mode of electrical connection between the pixel driving circuit A2 and the LED chip A1.

In some embodiments of the present disclosure, a specific material of the adhesive layer 402 is not specifically limited. For example, the material of the adhesive layer can be selected such that it has a strong adhesive force with a metal layer (Mo, Al, Ag, etc.) or a metal oxide layer (ITO, ZnO, etc.), and/or has a strong adhesive force with an inorganic LED substrate made of SiC, GaN and GaAs. In addition, in some examples, the adhesive layer 402 has the moisture content of less than 0.1%, so as to improve reliability of the display substrate.

In some examples, the LED chip A1 is adhered to the active driving circuit backplane 301 by the adhesive layer 402 (an adhesive). In this design, when the display substrate is being fabricated, the LED chip, available as a separate product, can be formed in a mode of directly adhering in an array, which is simple and convenient.

In some examples, a reflective layer 401 is further disposed between the LED chip A1 and the active driving circuit backplane 301. The reflective layer 401 can reflect light of a visible light waveband, and in this design, light leaked out of the LED to a backlight side can be reflected back to a light outgoing side, and thus, the luminance of display can be improved.

In some examples, the LED chip A1 has a size of a micron level, and includes a red LED, a green LED or a blue LED. Here, the red, green and blue LED chips are taken as three monochromatic sub-pixels of one display pixel, respectively, and are driven by three pixel driving circuits, respectively, and thus, can complete color display under RGB input. For example, a substrate 403 of the red LED is made of GaAs; a substrate 403 of the green LED is made of SiC; and a substrate 403 of the blue LED is made of GaN. When the LED structure is being formed specifically, materials of the substrates 403 of the LEDs of the three colors all differ from materials of the semiconductors (404 and 406), and thus, they should be formed by deposition, respectively.

After the LED structure (the LED substrate 403, the n-type semiconductor 404 in the LED, the electrode 405 connected with the n-type semiconductor, the p-type semiconductor 406 in the LED, and the electrode 407 connected with the p-type semiconductor) is formed, it is necessary to implement the electrical connection between the electrodes (405 and 407) of the LED chip A1 and the pixel driving circuit A2. Thus, for example, planarization layers made of an insulating material are disposed between the two electrodes of the light-emitting diode chip (e.g., 409), and between the LED chip A1 and the pixel driving circuit A2 (e.g., 408). Further, a via hole is disposed in the planarization layer (in positions corresponding to lead-out positions of the two electrodes of the LED and the pixel driving circuit A2, e.g., 405 and 306), and the conductive layer 311 is disposed on the planarization layer 408 between the LED chip A1 and the pixel driving circuit A2 of the pixel unit Pixel, for implementing the electrical connection between the electrode of the LED chip A1 and the pixel driving circuit A2 through the above-described via hole.

As can be seen with reference to the planarization layer 310 and the conductive layer 311 in FIG. 3(a), the above-described electrical connection is mainly to form the via hole above the electrode or above the source/drain electrode of the TFT, and arrange the conductive layer on the via hole, so that the electrical connection between the electrode and the source/drain electrode of the TFT is implemented by the conductive layer. This design adapts to the existing fabrication process of the display panel, and generally, the conductive layer may be made of indium tin oxide (ITO) (the transparent conductive material), which can reduce costs. It should be pointed out that, the electrical connection may be also formed between the electrode of the LED chip A1 and a connection electrode firstly, and then the electrical connection is formed between the connection electrode and the source/drain electrode of the TFT, so that the electrical connection between the LED chip A1 and the source/drain electrode of the TFT can be formed through the connection electrode.

Based on the above-described structure and connection relationship, light emission of each LED can be controlled by the active driving circuit backplane through the pixel driving circuit. It can be seen that, by using the display substrate, the active matrix LED display device can be formed. As a result of a display principle based on LED electroluminescence, the display substrate and the LED display device as described above will have a better display effect brought by excellent characteristics of the LED.

As one aspect thereof, as compared with the OLED, the inorganic LED displays the three colors, i.e., RGB, more accurately, and the display device with the inorganic LED as a display component can achieve a higher color fidelity; in addition, the inorganic LED is not limited to the service life of the organic light-emitting material, and thus is more durable.

Based on a same inventive concept, an embodiment of the present disclosure proposes a display device, the display device comprising any display substrate according to the above embodiments, and the display device may be: an Active Matrix/Light Emitting Diode (AMLED) panel, a mobile phone, a tablet personal computer, a television, a monitor, a laptop, a digital photo frame, a navigator, and any other product or component having a display function.

Since the display device provided by the embodiment of the present disclosure and the display substrate provided by the embodiments have the same technical features, they can solve the same technical problem and generate the same technical effect.

For the display substrate provided by the above embodiments, an embodiment of the present disclosure provides a manufacturing method of a display substrate, the display substrate comprising at least one pixel unit, the pixel unit including a pixel driving circuit and an LED chip, the method comprising:

step 501: forming an active driving circuit backplane, the active driving circuit backplane including a pixel driving circuit;

step 502: forming an adhesive layer on the active driving circuit backplane, and adhering the light-emitting diode chip to the active driving circuit backplane in a region corresponding to the pixel unit;

step 503: forming electrical connection between an electrode of the light-emitting diode chip and the pixel driving circuit.

With reference to a cross-sectional structure illustrated in FIG. 4, in the manufacturing method, forming the active driving circuit backplane 301 includes forming a pixel driving circuit A2 corresponding to the pixel unit Pixel (including forming thin film transistors T1 and T2, forming a capacitor C, and forming respective connection lines), then, forming an adhesive layer 402 on the active driving circuit backplane 301, and adhering the LED chip (including an LED substrate 403, an n-type semiconductor 404 in the LED, an electrode 405 connected with the n-type semiconductor, a p-type semiconductor 406 in the LED and an electrode 407 connected with the p-type semiconductor) to the active driving circuit backplane 301, in a region corresponding to the pixel unit Pixel, and finally encapsulating together (including forming a planarization layer and a conductive layer); the method corresponds to the display substrate provided by the above embodiments, and adapts to the existing fabrication process, which is simple and convenient.

For example, in some embodiments according to the present disclosure, various colors of light-emitting diode chips are fabricated independent of the active driving circuit backplane. Then, the fabricated light-emitting diode chips are disposed on the active driving circuit backplane, and the chip and the circuit in the circuit backplane are connected.

In some examples, the LED chip includes a red LED, a green LED or a blue LED (i.e., a case where each pixel includes three-color LED chips), and forming the pixel driving circuit in the pixel unit of the active driving circuit backplane includes: respectively forming pixel driving circuits corresponding to the red LED, the green LED and the blue LED, for outputting a corresponding driving current to electrodes of the red LED, the green LED and the blue LED, according to an external control signal, that is, respectively setting the pixel driving circuits to control independently, so as to precisely implement display of a specific color.

In some examples, in the step 502, before forming the adhesive layer on the active driving circuit backplane, the method further comprises: forming a reflective layer on the active driving circuit backplane. The reflective layer can reflect light of a visible light band, and consistent with what described above, in this design, light leaked out from the LED to a backlight side can be reflected back to a light outgoing side, and thus, the luminance of display can be improved.

In some examples, in the step 502, after adhering the LED chip, the method further comprises: performing low-temperature annealing and curing, in a case that characteristics of the thin film transistor and the LED in the display substrate are not affected.

In some examples, in the step 503: forming electrical connection between the electrode of the light-emitting diode chip and the pixel driving circuit includes: forming a planarization layer made of an insulating material on the LED chip and/or the pixel driving circuit; forming a via hole in the planarization layer, above the electrode of the LED chip and above a position corresponding to the pixel driving circuit, by exposing and developing; and forming a conductive layer on the planarization layer, the conductive layer being used for implementing the electrical connection between the electrode of the LED chip and the pixel driving circuit through the via hole. For specific structures, the planarization layer 310 and the conductive layer 311 in FIG. 3(*a*) and FIG. 4, the planarization layer 408 and the conductive layer 311 in FIG. 4, and the planarization layer 409 and the conductive layer 410 in FIG. 4 can be referred to. This design adapts to the existing fabrication process of the display panel, and generally, the conductive layer may be made of a transparent conductive material, e.g., indium tin oxide (ITO), which can reduce costs.

It can be seen that the manufacturing method of the display substrate provided by the embodiment of the present disclosure corresponds to the structure of any display substrate provided by the above embodiment, and at the same time, adapts to the existing fabrication process of the display panel, which is easy to implement with a low cost.

In summary, the embodiments of the present disclosure provide a display substrate and a manufacturing method thereof, and a display device; in the present disclosure, mainly by directly disposing the LED on the active driving circuit backplane, independent control of each LED is implemented, and thus the active matrix LED display device can be formed; in addition, since it makes full use of preferred display characteristics of the LED, as compared with an AMOLED, it is not limited by a service life of an organic light-emitting material, and has a better color fidelity.

It should be noted that, in this specification, terms like "first" and "second" are only used to differentiate one entity or operation from another, but are not necessarily used to indicate any practical relationship or order between these entities or operations. Moreover, terms such as "include", "comprise" or any variation of the terms mean "including but not limited to". Therefore, a process, method, object, or device that includes a series of elements not only includes these elements, but also includes other elements that are not specified expressly, or may further include inherent elements of the process, method, object or device. In the case that there are no more limitations, in the context of a element that is defined by "includes one ...", the process, method, object or device that includes the element may include other identical elements.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201410387601.2 filed on Aug. 7, 2014, the disclosure of which is incorporated herein by reference in its entirety as part of the present application.

The invention claimed is:

1. A display substrate, comprising:
   at least one pixel unit, wherein, the at least one pixel unit includes a pixel driving circuit located in an active driving circuit backplane, and a light-emitting diode chip disposed on the active driving circuit backplane, the light-emitting diode chip being electrically connected with the pixel driving circuit,
   wherein, the light-emitting diode chip and the pixel driving circuit are provided with a planarization layer thereon, the planarization layer is provided with a first via hole at a position corresponding to the light-emitting diode chip and a second via hole at a lead-out position of the pixel driving circuit, a conductive layer is provided on the planarization layer, and the conductive layer is electrically connected to an electrode of the light-emitting diode chip and the pixel driving circuit through the first via hole and the second via hole, respectively,
   wherein, the light-emitting diode chip is adhered to the active driving circuit backplane through an adhesive layer,
   wherein, a reflective layer is further provided between the light-emitting diode chip and the active driving circuit backplane, and
   wherein, the adhesive layer is physically and directly disposed on the reflective layer, and the reflective layer extends beyond the adhesive layer in a direction parallel to the active driving circuit backplane.

2. The display substrate according to claim 1, wherein, the pixel driving circuit is configured to output a corresponding driving current to the electrode of the light-emitting diode chip, according to an external control signal; and
   the light-emitting diode chip is configured to emit light with a corresponding luminance according to a current input from the electrode of the light-emitting diode chip.

3. The display substrate according to claim 2, wherein, the light-emitting diode chip is an inorganic light-emitting diode chip.

4. The display substrate according to claim 1, wherein, the light-emitting diode chip includes a red light-emitting diode, a green light-emitting diode, or a blue light-emitting diode.

5. The display substrate according to claim 4, wherein, a substrate of the red light-emitting diode is made of GaAs; a substrate of the green light-emitting diode is made of SiC; and a substrate of the blue light-emitting diode is made of GaN.

6. The display substrate according to claim 1, wherein, the light-emitting diode chip is an inorganic light-emitting diode chip.

7. The display substrate according to claim 1, wherein, the pixel driving circuit includes a thin film transistor.

8. The display substrate according to claim 7, wherein, the thin film transistor is an oxide thin film transistor, an amorphous silicon thin film transistor, a low-temperature polysilicon thin film transistor, or an organic thin film transistor.

9. The display substrate according to claim 7, wherein, the pixel driving circuit includes a first thin film transistor, a second thin film transistor and a capacitor,
   the first thin film transistor has a gate electrode connected with an external scanning signal, a source electrode connected with an external data signal, and a drain electrode connected with a gate electrode of the second thin film transistor and a first terminal of the capacitor; and
   the second thin film transistor has a drain electrode connected with a second terminal of the capacitor as well as an anode of a light-emitting diode in the light-emitting diode chip, and a source electrode connected with a power source voltage.

10. The display substrate according to claim 1, wherein, the adhesive layer has a moisture content of less than 0.1%.

11. The display substrate according to claim 1, the reflective layer is embedded into the active driving circuit backplane.

* * * * *